United States Patent
Hosokawa

(10) Patent No.: US 9,666,704 B2
(45) Date of Patent: May 30, 2017

(54) SEMICONDUCTOR DEVICE

(71) Applicant: Toyota Jidosha Kabushiki Kaisha, Toyota-shi, Aichi-ken (JP)

(72) Inventor: Hiroshi Hosokawa, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 78 days.

(21) Appl. No.: 14/942,539

(22) Filed: Nov. 16, 2015

(65) Prior Publication Data
US 2016/0141402 A1    May 19, 2016

(30) Foreign Application Priority Data

Nov. 17, 2014  (JP) ................................. 2014-232794

(51) Int. Cl.
| | |
|---|---|
| *H01L 29/739* | (2006.01) |
| *H01L 29/10* | (2006.01) |
| *H01L 29/06* | (2006.01) |
| *H01L 29/08* | (2006.01) |

(52) U.S. Cl.
CPC ...... *H01L 29/7397* (2013.01); *H01L 29/0615* (2013.01); *H01L 29/0696* (2013.01); *H01L 29/0834* (2013.01); *H01L 29/1095* (2013.01)

(58) Field of Classification Search
CPC ............. H01L 29/7397; H01L 29/0834; H01L 29/0696; H01L 29/1095; H01L 29/0615
See application file for complete search history.

(56) References Cited

U.S. PATENT DOCUMENTS

| | | | |
|---|---|---|---|
| 2010/0240183 A1 | 9/2010 | Narazaki | |
| 2013/0015802 A1* | 1/2013 | Hirose | ..................... B60L 3/00 318/488 |
| 2014/0048847 A1 | 2/2014 | Yamashita et al. | |
| 2016/0172471 A1* | 6/2016 | Hirabayashi | ........ H01L 29/7397 257/124 |

FOREIGN PATENT DOCUMENTS

| | | |
|---|---|---|
| JP | 2010-219277 A | 9/2010 |
| JP | 2013-048230 A | 3/2013 |

* cited by examiner

*Primary Examiner* — William F Kraig
*Assistant Examiner* — Pavel Ivanov
(74) *Attorney, Agent, or Firm* — Dinsmore & Shohl LLP

(57) ABSTRACT

A semiconductor substrate is provided with a first cell region, the first cell region including: an n-type emitter region; a p-type first top body region; an n-type first barrier region; an n-type first pillar region; and a p-type first bottom body region, the semiconductor substrate may further comprise: an n-type drift region; a p-type collector region; an n-type cathode region, the n-type first barrier region may include a first peak position where a peak of the n-type impurity density is present within a part linked to the n-type first pillar region, and a second peak position where a peak of the n-type impurity density is present within a part in contact with the gate insulating layer, and a depth of the first peak position from a front surface of the semiconductor substrate is different from a depth of the second peak position from the front surface of the semiconductor substrate.

2 Claims, 12 Drawing Sheets

SEMICONDUCTOR DEVICE

CROSS-REFERENCE TO RELATED APPLICATION

This application claims priority to Japanese Patent Application No. 2014-232794 filed on Nov. 17, 2014, the contents of which are hereby incorporated by reference into the present application.

TECHNICAL FIELD

The present disclosure provides technology that relates to a semiconductor device (RC-IGBT, which stands for "reverse conducting-insulated gate bipolar transistor") that functions as both an IGBT and a diode.

DESCRIPTION OF RELATED ART

Japanese Patent Application Publication No. 2013-48230 discloses an RC-IGBT. This RC-IGBT includes an IGBT structure configured by an n-type emitter region, a p-type top body region, an n-type bather region, a p-type bottom body region, an n-type drift region, a p-type collector region, a trench gate electrode, and the like, and the p-type top body region serves as an anode region to even provide a diode structure. In this RC-IGBT, the bather region is arranged between the top body region and the bottom body region, with an n-type pillar region arranged to connect the bather region to a front surface electrode (which serves as both an emitter electrode and an anode electrode). The pillar region is arranged in a space between adjacent gate trenches.

In this RC-IGBT, an electric potential of the bather region is maintained close to an electric potential of the front surface electrode. This makes it difficult to turn on a diode configured by a p-n junction between the body region and the bather region. This diode is turned on in response to a further rise in the electric potential of the front surface electrode. The RC-IGBT of Japanese Patent Application Publication No. 2013-48230 utilizes the bather region and the pillar region to suppress holes from flowing from the p-type body region into the n-type bather region and the n-type drift region, thereby suppressing a flow of a reverse recovery current through the diode. Further, in this RC-IGBT, application of a backward voltage (i.e. a voltage that causes the front surface electrode to be lower in electric potential) causes an electric field to be distributed between a depletion layer extending from a p-n junction between the top body region and the bather region and a depletion layer extending from a p-n junction between the drift region and the bottom body region. This brings about an improvement in breakdown voltage to the backward voltage.

In the RC-IGBT of Japanese Patent Application Publication No. 2013-48230, the IGBT can be turned on by applying a predetermined on electric potential to a trench gate electrode with a backward voltage being applied. In so doing, channels are formed in ranges of the top and bottom body regions that face the trench gate electrode. In the RC-IGBT of Japanese Patent Application Publication No. 2013-48230, a p-type impurity density of the bottom body region is lower than a p-type impurity density of the top body region. Therefore, when a predetermined on electric potential is applied to the trench gate electrode, the formation of a channel in the bottom body region precedes the formation of a channel in the top body region. In a state where a channel has been formed only in the bottom body region, a leak current flows through the collector region, the drift region, the channel formed in the bottom body region, the bather region, and the pillar region. Thereafter, a channel is formed also in the top body region, and a current flows through the collector region, the drift region, the channel formed in the bottom body region, the bather region, the channel formed in the top body region, and the emitter region. That is, the IGBT is turned on. The term "leak current" as used herein means a current that flows in a state where a channel has been formed in the bottom body region but no channel has been formed in the top body region. A larger leak current causes a problem, e.g. makes it difficult to determine whether the RC-IGBT is defective.

BRIEF SUMMARY

The present disclosure provides a technology by which a leak current that flows when an insulated gate bipolar transistor (IGBT) is being turned on can be made smaller than by a conventional semiconductor device.

One embodiment of a semiconductor device disclosed in this disclosure comprises: a semiconductor substrate; a front surface electrode located on a front surface of the semiconductor substrate; and a back surface electrode located on a back surface of the semiconductor substrate, wherein a plurality of gate trenches is arranged on the front surface of the semiconductor substrate, in each of the gate trenches, a gate insulating layer and a gate electrode are located, the gate electrode being insulated from the semiconductor substrate by the gate insulating layer. The semiconductor substrate comprises a first cell region comprising: an n-type emitter region; a p-type first top body region; an n-type first bather region; an n-type first pillar region; and a p-type first bottom body region. The n-type emitter region is located between a first gate trench and a second gate trench which is adjacent to the first gate trench among the plurality of the gate trenches, the emitter region being in contact with the gate insulating layer, and the emitter region being connected to the front surface electrode. The p-type first top body region is located between the first gate trench and the second gate trench, the first top body region being in contact with the gate insulating layer at a position deeper than the emitter region. The n-type first barrier region is located between the first gate trench and the second gate trench, the first barrier region being in contact with the gate insulating layer at a position deeper than the first top body region. The n-type first pillar region is located between the first gate trench and the second gate trench, the first pillar region being connected to the front surface electrode, and the first pillar region being linked to the first barrier region. The p-type first bottom body region is located between the first gate trench and the second gate trench, the first bottom body region being in contact with the gate insulating layer at a position deeper than the first barrier region, the first bottom body region being separated from the first top body region by the first bather region, and a p-type impurity density of the first bottom body region being lower than a p-type impurity density of the first top body region. The semiconductor substrate further comprises: an n-type drift region located at a position deeper than the first bottom body region, the drift region being separated from the first bather region by the first bottom body region, and an n-type impurity density of the drift region being lower than an n-type impurity density of the first bather region; a p-type collector region connected to the back surface electrode; and an n-type cathode region connected to the back surface electrode, an n-type impurity density of the cathode region being higher than the n-type impurity density of the drift region. The first barrier region includes a first peak position where a peak of the n-type impurity density is present within a part linked to the first pillar region, and a second peak position where a peak of the n-type impurity density is present within a part in contact with the gate insulating layer, and a depth of the first peak position from the front surface of the semiconductor substrate is different from a depth of the second peak position from the front surface of the semiconductor substrate.

In the semiconductor device described above, an IGBT is formed by the emitter region, the first top body region, the first barrier region, the first bottom body region, the drift region, the collector region, the gate electrode in the first gate trench, the gate electrode in the second gate trench, and the like. Further, a p-n diode is formed by the first top body region, the first bather region, the first bottom body region, the drift region, the cathode region, and the like.

In this semiconductor device, the first barrier region includes the first peak position where the peak of the n-type impurity density is present within the part linked to the first pillar region, and the second peak position where a peak of the n-type impurity density is present within the part in contact with the gate insulating layer, and the depth of the first peak position from the front surface of the semiconductor substrate is different from the depth of the second peak position from the front surface of the semiconductor substrate. Therefore, when the formation of a channel in the bottom body region precedes the formation of a channel in the top body region when the IGBT is being turned on, a path through which a leak current flows is longer than in the RC-IGBT of Japanese Patent Application Publication No. 2013-48230. An increase in length of the path causes an increase in resistance to the flow of a leak current, thus making it difficult for the leak current to flow. Therefore, in this semiconductor device, a leak current that flows when the IGBT is being turned on can be suppressed more than in the case of Japanese Patent Application Publication No. 2013-48230.

DETAILED DESCRIPTION

First Embodiment

Figure 1:
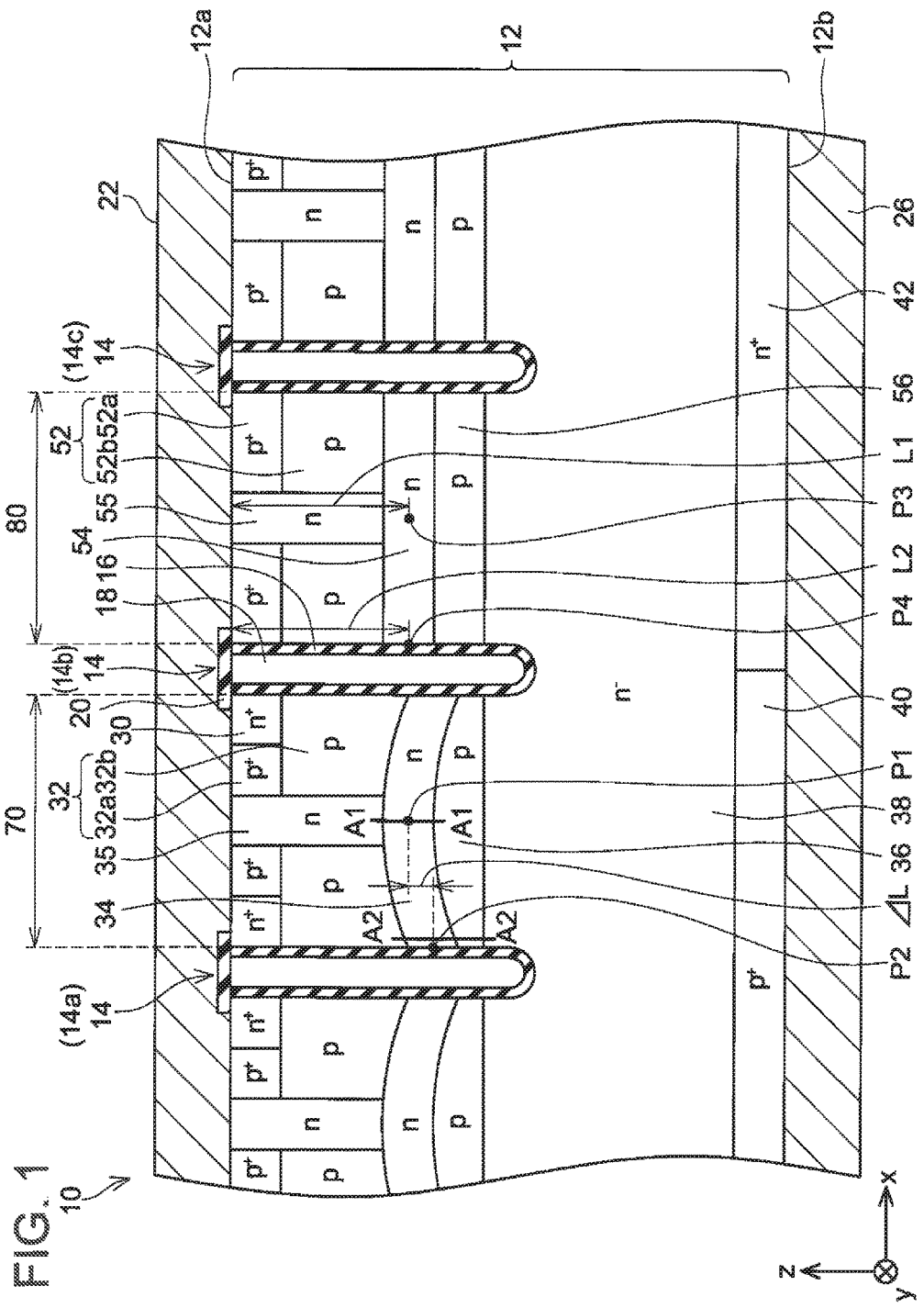
FIG. 1 is a cross-sectional view of a semiconductor device 10 according to a first embodiment.
Figure 2:
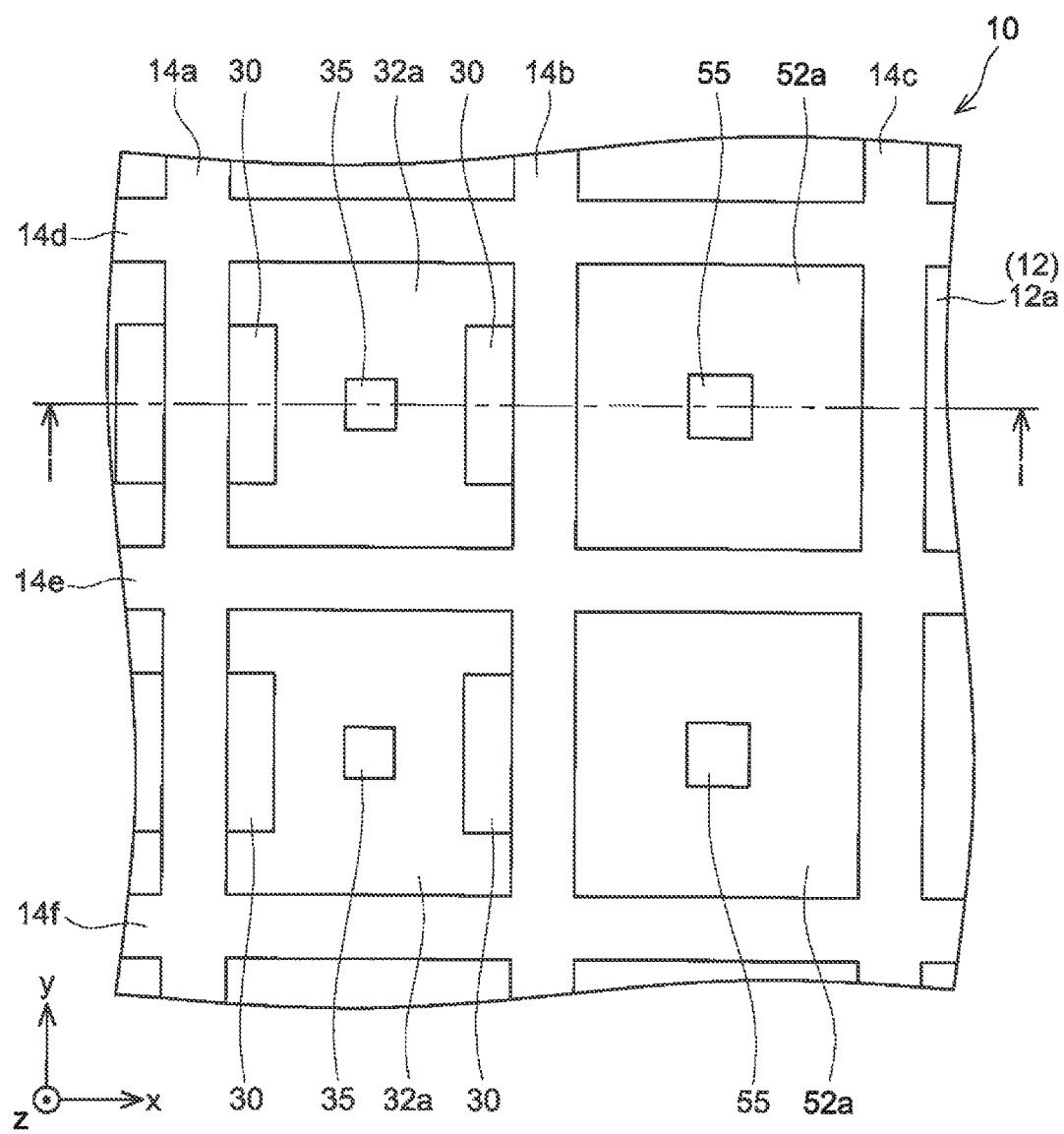
FIG. 2 is a plan view showing an arrangement of gate trenches 14a, 14b, 14c, 14d, 14e, and 14f in a front surface 12a of a semiconductor substrate 12.

A semiconductor device 10 according to a first embodiment is described with reference to FIGS. 1 to 5. The semiconductor device 10 is an RC-IGBT including an IGBT and a diode. As shown in FIGS. 1 and 2, the semiconductor device 10 includes a semiconductor substrate 12 made of Si. In FIGS. 1, 2, 4, and 5, a z direction is a thickness direction of the semiconductor substrate 12, an x direction is a direction parallel to a front surface 12a of the semiconductor substrate 12, and a y direction is a direction orthogonal to the z direction and the x direction.

As shown in FIG. 1, an upper electrode 22 is arranged on the front surface 12a of the semiconductor substrate 12. The upper electrode 22 is made of Al, or AlSi. Alternatively, the upper electrode 22 may be a laminated electrode including stacked layers of Al (or AlSi), Ti, Ni, and Au on the front surface 12a. The upper electrode 22 has a thickness (i.e. a z-direction length) of approximately 5 to 30 μm.

A lower electrode 26 is arranged on a back surface 12b of the semiconductor substrate 12. The lower electrode 26 is a laminated electrode including stacked layers of Al (or AlSi), Ti, Ni, and Au on the back surface 12b. Alternatively, the lower electrode 26 may be a laminated electrode including stacked layers of Ti, Ni, and Au on the back surface 12b. The lower electrode 26 has a thickness of approximately 1 to 30 μm.

As shown in FIG. 2, a plurality of gate trenches 14 (14a, 14b, 14c, 14d, 14e, and 140 are arranged in a gridlike fashion in the front surface 12a of the semiconductor substrate 12. For the sake of clearer illustration, FIG. 2 omits to illustrate the upper electrode 22 and an interlayer insulating layer 20 (described later), which are arranged on an upper surface of each of the gate trenches 14. The gate trenches 14a, 14b, and 14c extend linearly along the y direction. The gate trenches 14a, 14b, and 14c are placed at intervals from each other along the x direction, and extend substantially parallel to each other. The gate trenches 14d, 14e, and 14f extend linearly along the x direction. The gate trenches 14d, 14e, and 14f are placed at intervals from each other along the y direction, and extend substantially parallel to each other. The gate trenches 14a, 14b, and 14c intersect the gate trenches 14d, 14e, and 14f.

As shown in FIG. 1, each of the gate trenches 14 extends along the z-direction (downward) from the front surface 12a of the semiconductor substrate 12. The gate trenches 14 are substantially equal in depth to each other. Each of the gate trenches 14 can have a depth of approximately 4 to 6 μm. Each of the gate trenches 14 has its inner surface covered with a gate insulating layer 16. Provided in each of the gate trenches 14 is a gate electrode 18. For the sake of clearer illustration, FIG. 1 omits hatching in the semiconductor substrate 12. Each gate electrode 18 is insulated from the semiconductor substrate 12 by the gate insulating layer 16. Each gate electrode 18 has its upper surface covered with the interlayer insulating layer 20. Each gate electrode 18 is insulated from the upper electrode 22 by the interlayer insulating layer 20. Each gate electrode 18 is electrically connected to a gate wire (not illustrated) in a contact portion (not illustrated).

The semiconductor substrate 12 includes an IGBT region 70 arranged between adjacent gate trenches 14a and 14b. The IGBT region 70 includes emitter regions 30, an IGBT top body region 32, an IGBT bather region 34, an IGBT pillar region 35, and an IGBT bottom body region 36.

The emitter regions 30 are n-type semiconductor regions containing arsenic or phosphorus as impurities. The emitter regions 30 are exposed on the front surface 12a of the semiconductor substrate 12. The emitter regions 30 are in ohmic contact with the upper electrode 22. Each of the emitter region 30 is in contact with the corresponding gate insulating layer 16. Each emitter region 30 has an n-type impurity density of approximately $1 \times 10^{17}$ to $5 \times 10^{20}/cm^3$. Each emitter region 30 has a thickness of approximately 0.2 to 1.5 μm.

The IGBT top body region 32 is a p-type semiconductor region containing boron as impurities. The IGBT top body region 32 is arranged on lateral and lower sides of the emitter regions 30, and is in contact with the emitter regions 30. The IGBT top body region 32 is exposed on the front surface 12a of the semiconductor substrate 12 on the lateral sides of the emitter regions 30. The IGBT top body region 32 includes a high-density region 32a having a high p-type impurity density and a low-density region 32b having a low p-type impurity density. The high-density region 32a is provided in a position in contact with the upper electrode 22. The low-density region 32b is provided on a lower side of the high-density region 32a. The high-density region 32a is in ohmic contact with the upper electrode 22. Further, the low-density region 32b is in contact with the gate insulating layers 16 on the lower sides of the emitter regions 30. The high-density region 32a has a p-type impurity density of approximately $1 \times 10^{17}$ to $1 \times 10^{20}/cm^3$. The low-density region 32b has a p-type impurity density of approximately $1 \times 10^{16}$ to $1 \times 10^{19}/cm^3$. The IGBT top body region 32 has a thickness of approximately 0.5 to 5.0 μm.

The IGBT bather region 34 is an n-type semiconductor region containing phosphorus as impurities. The IGBT bather region 34 is arranged on a lower side of the IGBT top body region 32, and is in contact with the IGBT top body region 32. The IGBT bather region 34 is in contact with the gate insulating layers 16 on the lower side of the IGBT top body region 32. The IGBT bather region 34 is separated from the emitter regions 30 by the IGBT top body region 32. The IGBT bather region 34 is formed in a shape of an arch convex toward the front surface 12a of the semiconductor substrate 12 (i.e. upward in the drawing) as viewed in a cross-sectional view of the semiconductor substrate 12. The IGBT bather region 34 has an n-type impurity density of approximately $1 \times 10^{15}$ to $1 \times 10^{18}/cm^3$. The IGBT bather region 34 has a thickness of approximately 0.2 to 3.0 μm.

The IGBT pillar region 35 is an n-type semiconductor region containing phosphorus as impurities. The IGBT pillar region 35 is arranged on a lateral side of the IGBT top body region 32, and is in contact with the IGBT top body region 32. The IGBT pillar region 35 extends in the thickness direction of the semiconductor substrate 12 (i.e. downward in the drawing) from the front surface 12a of the semiconductor substrate 12 to the IGBT bather region 34. The IGBT pillar region 35 has its upper end exposed on the front surface 12a of the semiconductor substrate 12, and the upper end is in Schottky contact with the upper electrode 22. The IGBT pillar region 35 has its lower end linked to the IGBT bather region 34. The IGBT pillar region 35 is separated from the emitter regions 30 by the IGBT top body region 32. The IGBT pillar region 35 is arranged in a position away from the gate insulating layers 16. That is, the IGBT pillar region 35 is arranged in a center of the IGBT region 70, and is not in contact with the gate insulating layers 16. The IGBT pillar region 35 has an n-type impurity density of approximately $1 \times 10^{16}$ to $1 \times 10^{19}/cm^3$.

Figure 3:
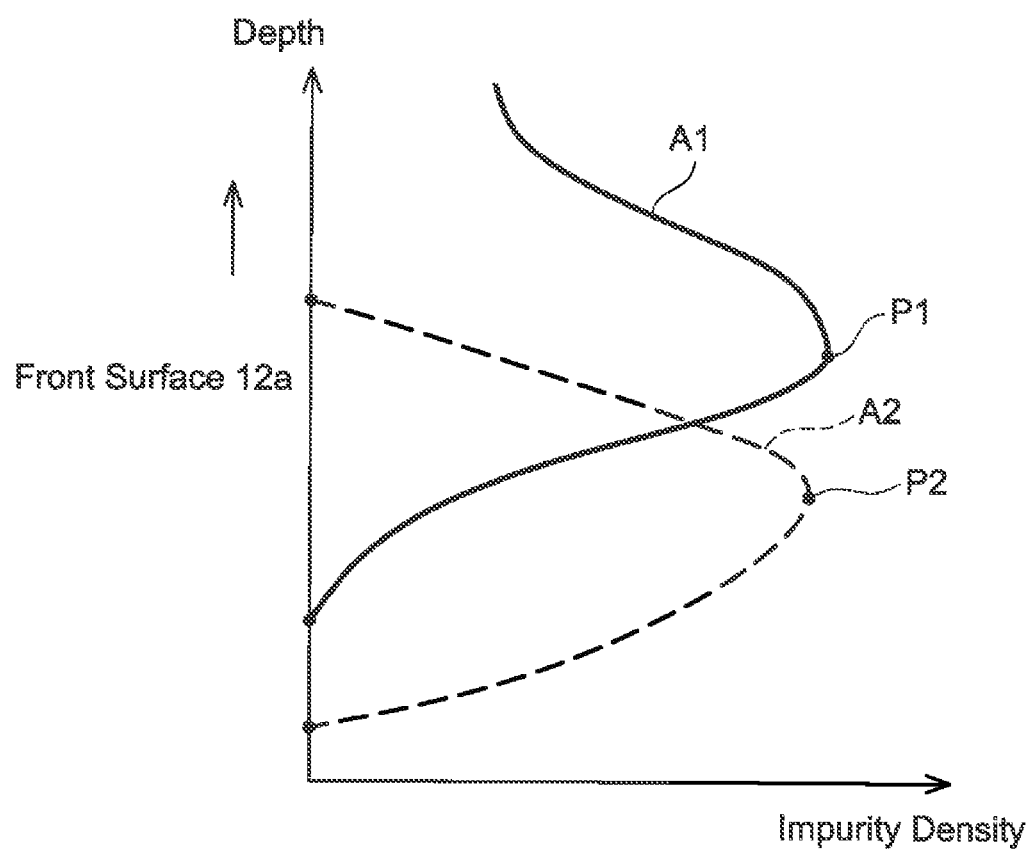
FIG. 3 is a graph showing an n-type impurity density of an IGBT bather region 34 in a depth direction.

FIG. 3 is a graph showing the n-type impurity density of the IGBT bather region 34 in a depth direction. A curve A1 indicates a distribution of the n-type impurity density along a line A1-A1 in FIG. 1, and a curve A2 indicates a distribution of the n-type impurity density along a line A2-A2 in FIG. 1. As mentioned above, the IGBT bather region 34 is formed in the shape of an arch convex toward the front surface 12a of the semiconductor substrate 12 (i.e. upward in the drawing). Therefore, the IGBT bather region 34 includes a peak position P1 where a peak of the n-type impurity density is present within a part linked to the IGBT pillar region 35, and a peak position P2 where a peak of the n-type impurity density is present within a part in contact with the gate insulating layer 16, and a depth of the peak position P1 from the front surface 12a is shallower than a depth of the peak position P2 from the front surface 12a.

The IGBT bottom body region 36, which is shown in FIG. 1, is a p-type semiconductor region containing boron as impurities. The IGBT bottom body region 36 is arranged on a lower side of the IGBT bather region 34, and is in contact with the IGBT bather region 34. The IGBT bottom body region 36 is in contact with the gate insulating layers 16 on the lower side of the IGBT bather region 34. The IGBT bottom body region 36 is separated from the IGBT top body region 32 by the IGBT bather region 34. The IGBT bottom body region 36 has a lower p-type impurity density than the low-density region 32b of the IGBT top body region 32. The IGBT bottom body region 36 has a p-type impurity density of approximately $1 \times 10^{15}$ to $1 \times 10^{19}/cm^3$. The IGBT bottom body region 36 has a thickness of approximately 0.2 to 3.0 μm.

The semiconductor substrate 12 includes a diode region 80 arranged between the adjacent gate trenches 14b and 14c. The diode region 80 includes a diode top body region 52, a diode bather region 54, a diode pillar region 55, and a diode bottom body region 56.

The diode top body region 52 is a p-type semiconductor region containing boron as impurities. The diode top body region 52 is exposed on the front surface 12a of the semiconductor substrate 12. The diode top body region 52 includes an anode region 52a having a high p-type impurity density and a low-density region 52b having a low p-type impurity density. The anode region 52a is arranged in a range exposed on the front surface 12a of the semiconductor substrate 12, and is in ohmic contact with the upper electrode 22. The low-density region 52b is provided on a lower side of the anode region 52a. Further, the diode top body region 52 is in contact with the gate insulating layers 16. The anode region 52a has a p-type impurity density of approximately $1 \times 10^{17}$ to $1 \times 10^{20}/cm^3$. The low-density region 52b has a p-type impurity density of approximately $1 \times 10^{16}$ to $1 \times 10^{19}/cm^3$. The diode top body region 52 has a thickness of approximately 0.2 to 5.0 μm.

The diode bather region 54 is an n-type semiconductor region containing phosphorus as impurities. The diode bather region 54 is arranged on a lower side of the diode top body region 52, and is in contact with the diode top body region 52. The diode bather region 54 is in contact with the gate insulating layers 16 on the lower side of the diode top body region 52. The diode bather region 54 has an n-type impurity density of approximately $1\times10^{15}$ to $1\times10^{18}/cm^3$. The diode bather region 54 has a thickness of approximately 0.2 to 3.0 μm.

The diode pillar region 55 is an n-type semiconductor region containing phosphorus as impurities. The diode pillar region 55 is arranged on a lateral side of the diode top body region 52, and is in contact with the diode top body region 52. The diode pillar region 55 extends in the thickness direction of the semiconductor substrate 12 (i.e. downward in the drawing) from the front surface 12a of the semiconductor substrate 12 to the diode bather region 54. The diode pillar region 55 has its upper end exposed on the front surface 12a of the semiconductor substrate 12, and the upper end is in Schottky contact with the upper electrode 22. The diode pillar region 55 has its lower end linked to the diode bather region 54. The diode pillar region 55 is arranged in a position away from the gate insulating layers 16. That is, the diode pillar region 55 in the diode region 80 is arranged in a center of the diode region 80, and is not in contact with the gate insulating layers 16. The diode pillar region 55 has an n-type impurity density of approximately $1\times10^{16}$ to $1\times10^{19}/cm^3$.

As shown in FIG. 1, the diode bather region 54 is formed flat instead of being formed in the shape of an arch like the above IGBT bather region 34 as viewed in a cross-sectional view of the semiconductor substrate 12. Therefore, the diode barrier region 54 includes a peak position P3 where a peak of the n-type impurity density is present within a part linked to the diode pillar region 55, and a peak position P4 where a peak of the n-type impurity density is present within a part in contact with the gate insulating layer 16, and a depth L1 of the peak position P3 from the front surface 12a is substantially equal to a depth L2 of the peak position P4 from the front surface 12a. That is, in the first embodiment, a difference ΔL between the depth of the peak position P1 and the depth of the peak position P2 is larger than a difference between the depth L1 of the peak position P3 and the depth L2 of the peak position P4.

The diode bottom body region 56 is a p-type semiconductor region containing boron as impurities. The diode bottom body region 56 is arranged on a lower side of the diode bather region 54, and is in contact with the diode bather region 54. The diode bottom body region 56 is in contact with the gate insulating layers 16 on the lower side of the diode bather region 54. The diode bottom body region 56 is separated from the diode top body region 52 by the diode bather region 54. The diode bottom body region 56 has a p-type impurity density of approximately $1\times10^{15}$ to $1\times10^{19}/cm^3$. The diode bottom body region 56 has a lower p-type impurity density than the low-density region 52b of the diode top body region 52. The diode bottom body region 56 has a thickness of approximately 0.2 to 3.0 μm.

It should be noted that the diode region 80 does not include an n-type semiconductor region (i.e. an n-type semiconductor region that is in contact with the gate insulating layers 16 and is separated from the diode bather region 54 and the diode pillar region 55) that corresponds to the emitter regions 30 of the IGBT region 70.

The semiconductor substrate 12 further includes a drift region 38, a collector region 40, and a cathode region 42.

The drift region 38 is an n-type semiconductor region containing phosphorus as impurities. The drift region 38 is arranged across a region on a lower side of the IGBT bottom body region 36 of the IGBT region 70 and a region on a lower side of the diode bottom body region 56 of the diode region 80. The drift region 38 is in contact with the IGBT bottom body region 36 and the diode bottom body region 56.

Further, the drift region 38 is in contact with a lower end of each gate insulating layer 16. The drift region 38 is separated from the IGBT bather region 34 by the IGBT bottom body region 36, and is separated from the diode bather region 54 by the diode bottom body region 56. An n-type impurity density of the drift region 38 is lower than the n-type impurity density of the IGBT bather region 34 and the n-type impurity density of the diode bather region 54. The drift region 38 has an n-type impurity density of approximately $1\times10^{12}$ to $1\times10^{15}/cm^3$.

The collector region 40 is a p-type semiconductor region containing boron as impurities. The collector region 40 is arranged on a lower side of the drift region 38 in a range on a lower side of the IGBT region 70. The collector region 40 is in contact with the drift region 38. The collector region 40 is exposed on the back surface 12b of the semiconductor substrate 12. The collector region 40 is in ohmic contact with the lower electrode 26. The collector region 40 has a p-type impurity density of approximately $1\times10^{17}$ to $1\times10^{20}/cm^3$. The collector region 40 has a thickness of 0.2 to 3.0 μm.

The cathode region 42 is an n-type semiconductor region containing phosphorus as impurities. The cathode region 42 is arranged on the lower side of the drift region 38 in a range on a lower side of the diode region 80. The cathode region 42 is in contact with the drift region 38. The cathode region 42 is exposed on the back surface 12b of the semiconductor substrate 12. The cathode region 42 is in ohmic contact with the lower electrode 26. An n-type impurity density of the cathode region 42 is higher than the n-type impurity densities of the drift region 38, the diode bather region 54, and the diode pillar region 55. The cathode region 42 has an n-type impurity density of approximately $1\times10^{17}$ to $1\times10^{20}/cm^3$. The cathode region 42 has a thickness of approximately 0.2 to 3.0 μm.

In the semiconductor substrate 12, an IGBT connected between the upper electrode 22 and the lower electrode 26 is formed by the emitter regions 30, the IGBT top body region 32, the IGBT bather region 34, the IGBT bottom body region 36, the drift region 38, the collector region 40, the corresponding gate electrode 18, and the corresponding gate insulating layer 16. During operation of the IGBT, the upper electrode 22 functions as an emitter electrode of the IGBT and the lower electrode 26 functions as a collector electrode of the IGBT. Further, in the semiconductor substrate 12, a p-n diode connected between the upper electrode 22 and the lower electrode 26 is formed by the diode top body region 52, the diode bather region 54, the diode bottom body region 56, the drift region 38, and the cathode region 42. Further, in the semiconductor substrate 12, a p-n diode connected between the upper electrode 22 and the lower electrode 26 is also formed by the IGBT top body region 32, the IGBT bather region 34, the IGBT bottom body region 36, the drift region 38, and the cathode region 42. During operation of these p-n diodes, the upper electrode 22 functions as an anode electrode of each of the p-n diodes and the lower electrode 26 functions as a cathode electrode of each of the p-n diodes. In the semiconductor substrate 12, a Schottky bather diode (hereinafter referred to as "SBD") connected between the upper electrode 22 and the lower electrode 26 is formed by the diode pillar region 55, the diode bather region 54, the drift region 38, and the cathode region 42. Further, in the semiconductor substrate 12, an SBD connected between the upper electrode 22 and the lower electrode 26 is also formed by the IGBT pillar region 35, the IGBT bather region 34, the drift region 38, and the cathode region 42. During operation of these SBDs, the upper electrode 22 functions as an anode electrode of each of the SBDs and the lower electrode 26 functions as a cathode electrode of each of the SBDs.

Figure 4:
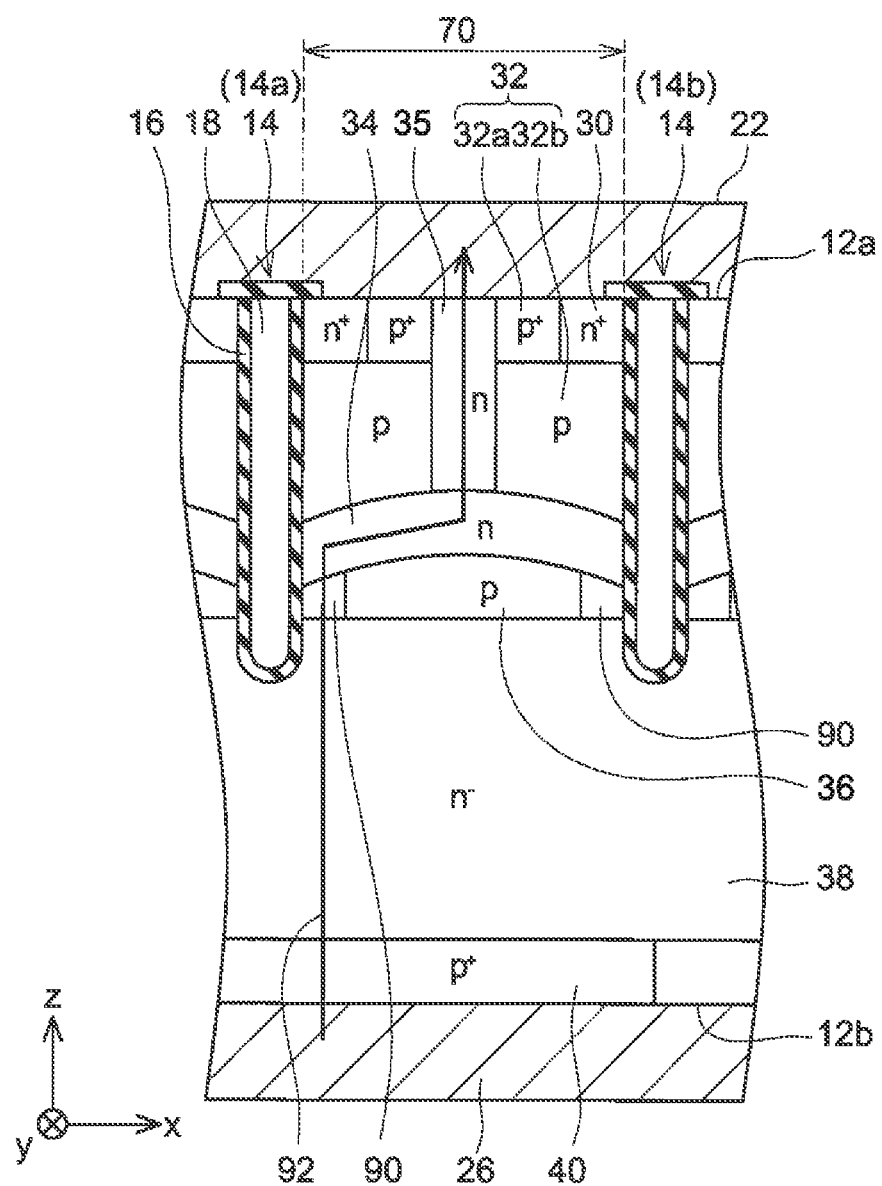
FIG. 4 is an explanatory diagram (1) showing how an IGBT in the semiconductor device 10 according to the first embodiment operates.

The following describes how the IGBT operates. In turning on the IGBT, a higher electric potential is applied to the lower electrode 26 than to the upper electrode 22. Further, an electric potential of the gate electrode 18 is raised. When the electric potential of the gate electrode 18 reaches a predetermined first threshold value, a channel 90 is first formed in a part of the IGBT bottom body region 36 located near the gate insulating layers 16 as shown in FIG. 4. At this point in time, no channel has been formed in a part of the IGBT top body region 32 located near the gate insulating layers 16. The formation of the channel 90 in the IGBT bottom body region 36 precedes the formation of a channel in the IGBT top body region 32 because the p-type impurity density of the IGBT bottom body region 36 is lower than the p-type impurity density of the IGBT top body region 32 and therefore a threshold electric potential at which a channel is formed in the IGBT bottom body region 36 is lower than that at which a channel is formed in the IGBT top body region 32. Once the channel 90 is formed in the IGBT bottom body region 36, electrons flow from the upper electrode 22 toward the lower electrode 26 via the IGBT pillar region 35, the IGBT bather region 34, the channel 90, the drift region 38, and the collector region 40. This causes a current to flow from the lower electrode 26 toward the upper electrode 22 via the collector region 40, the drift region 38, the channel 90, the IGBT bather region 34, and the IGBT pillar region 35 as indicated by an arrow 92 in FIG. 4. Since the current easily flows along a depth of peak density of the IGBT bather region 34, a larger amount of the current flows through a central portion of the IGBT bather region 34 in the depth direction, as indicated by the arrow 92. Such a current that flows through a path indicated by the arrow 92 in FIG. 4 is hereinafter referred to as "leak current".

Figure 5:
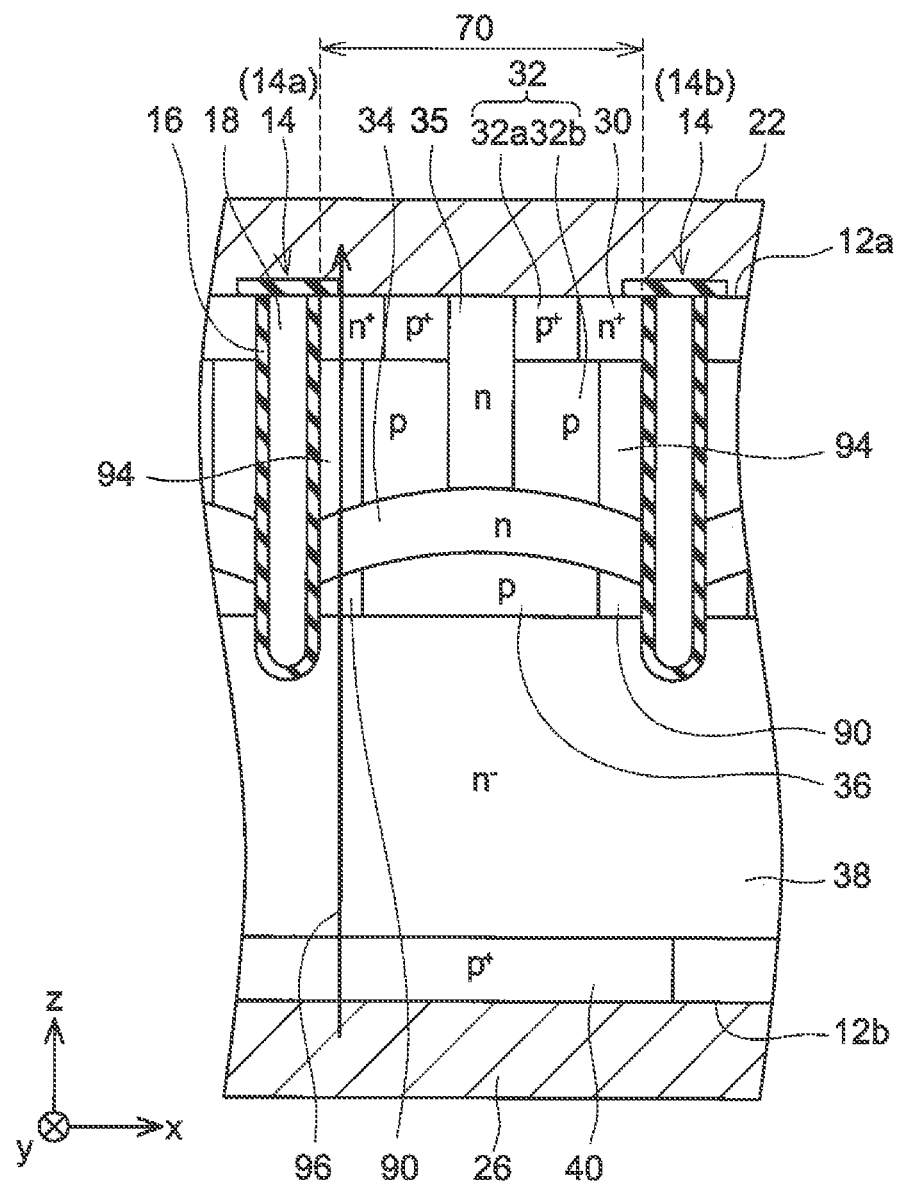
FIG. 5 is an explanatory diagram (2) showing how the IGBT in the semiconductor device 10 according to the first embodiment operates.

Thereafter, when the electric potential of the gate electrode 18 reaches an electric potential (i.e. an on electric potential) having a second threshold value that is higher than the first threshold value, a channel 94 is formed in a part of the IGBT top body region 32 located near the gate insulating layers 16, as shown in FIG. 5. Once the channel 94 is formed in the IGBT top body region 32, electrons flow from the upper electrode 22 toward the lower electrode 26 via the emitter regions 30, the channel 94, the IGBT bather region 34, the channel 90, the drift region 38, and the collector region 40. This causes a current to flow from the lower electrode 26 toward the upper electrode 22 via the collector region 40, the drift region 38, the channel 90, the IGBT bather region 34, the channel 94, and the emitter regions 30 as indicated by an arrow 96 in FIG. 5. Once the current starts to flow through a path indicated by the arrow 96 in FIG. 5, the leak current (see the arrow 92 in FIG. 4) no longer flows. That is, the leak current flows only for a short period of time until the IGBT is turned on.

Thereafter, when the electric potential of the gate electrode 18 is lowered to be less than the first threshold value, the channels 90 and 92 disappear and the current stops flowing. That is, the IGBT is turned off.

Figure 6:
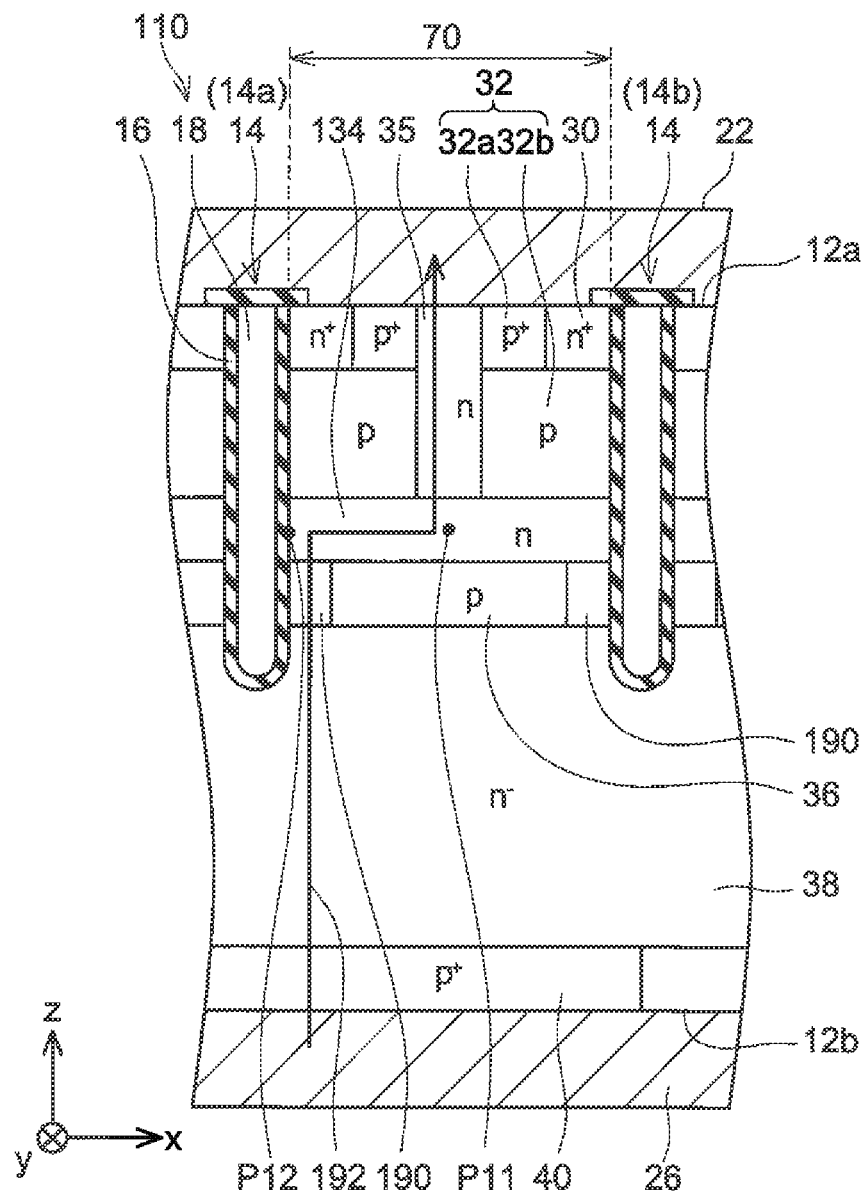
FIG. 6 is an explanatory diagram showing how an IGBT in a conventional semiconductor device 110 operates.

For a sufficient explanation of operation and effect of when the IGBT of the semiconductor device 10 according to the first embodiment operates, a comparative example where an IGBT of a conventional semiconductor device operates is described below with reference to FIG. 6. As shown in FIG. 6, the conventional semiconductor device 110 includes substantially the same configuration as that of the semiconductor device 10 according to the first embodiment shown in FIG. 1. In FIG. 6, the same components as those of the semiconductor device 10 shown in FIG. 1 are indicated by the same reference numerals as those shown in FIG. 1. As shown in FIG. 6, the conventional semiconductor device 110 differs from the semiconductor device 10 shown in FIG. 1 in shape of an IGBT bather region 134. In the conventional semiconductor device 110, the IGBT bather region 134 is formed flat instead of being formed in the shape of an arch like the IGBT bather region 34 shown in FIG. 1. Therefore, the IGBT bather region 134 includes a peak position P11 where a peak of the n-type impurity density is present within a part linked to the IGBT pillar region 35, and a peak position P12 where a peak of the n-type impurity density is present within a part in contact with the gate insulating layer 16, and a depth of the peak position P11 from the front surface 12a is substantially equal to a depth of the peak position P12 from the front surface 12a.

When the electric potential of the gate electrode 18 reaches the first threshold value when turning on the IGBT of the conventional semiconductor device 110, a channel 190 is first formed in a part of the IGBT bottom body region 36 located near the gate insulating layers 16 as shown in FIG. 6. At this point in time, no channel has been formed in a part of the IGBT top body region 32 located near the gate insulating layers 16. This causes a leak current to flow from the lower electrode 26 toward the upper electrode 22 via the collector region 40, the drift region 38, the channel 190, the IGBT barrier region 34, and the IGBT pillar region 35 as indicated by an arrow 192 in FIG. 6. After that, a further rise in the electric potential of the gate electrode 18 causes the IGBT to be turned on in the same manner as in the first embodiment. In the conventional semiconductor device 110, as described above, the IGBT bather region 134 is formed flat, and the depth of the peak position P11 is substantially equal to the depth of the peak position P12. Therefore, a path through which the leak current flows in the IGBT bather region 34 is comparatively short as indicated by the arrow 192. That is, resistance to the flow of leak current is low. This causes a comparatively large leak current to flow.

Figure 7:
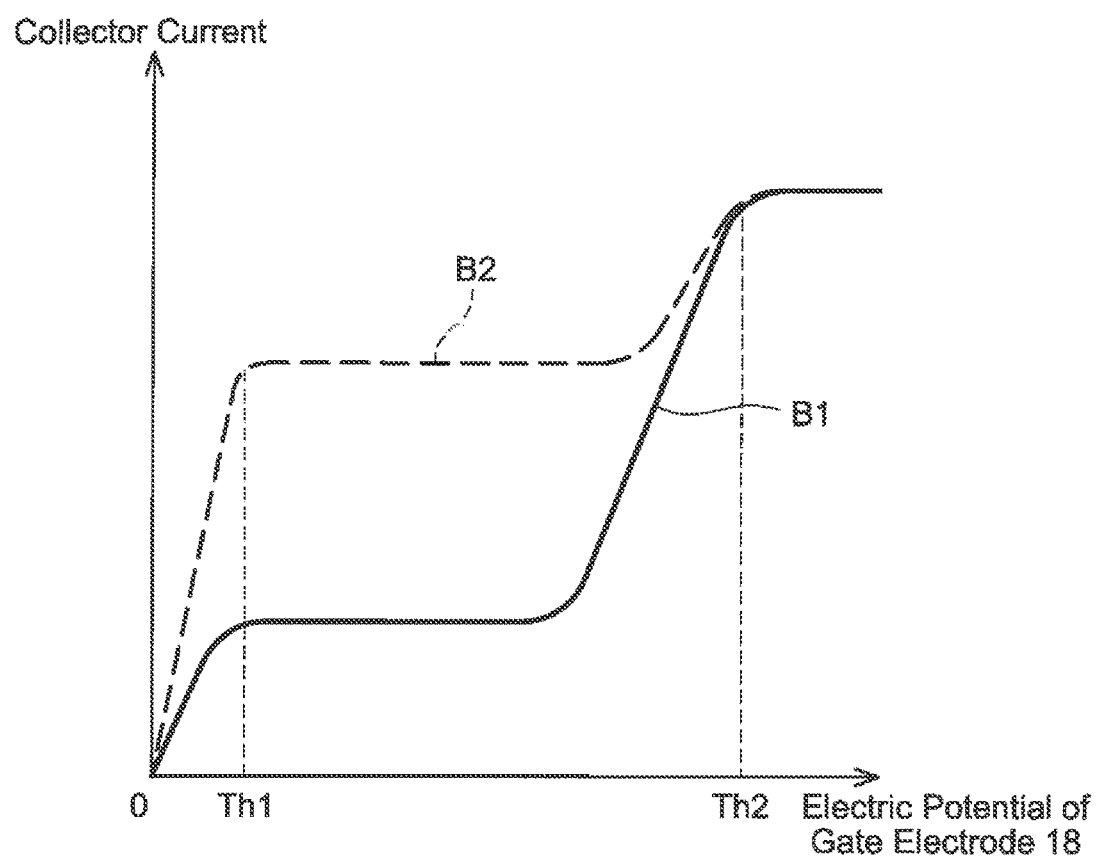
FIG. 7 is a graph showing a relationship between an electric potential of a gate electrode 18 and a collector current.

In the conventional semiconductor device 110, as described above, a large leak current flows when the IGBT is being turned on. FIG. 7 is a graph showing a relationship between the electric potential of the gate electrode 18 and a collector current at the time that the IGBT is being turned on. A curve B1 shows a relationship between the electric potential of the gate electrode 18 and a collector current in the semiconductor device 10 according to the first embodiment. A curve B2 shows a relationship between the electric potential of the gate electrode 18 and a collector current in the conventional semiconductor device 110. In FIG. 7, Th1 and Th2 indicate the first and second threshold values, respectively. If a leak current that flows when the gate electric potential exceeds the first threshold value is large as indicated by the curve B2, it is difficult to detect a leak current that flows due to another factor. This makes it difficult to determine whether the conventional semiconductor device 110 is defective.

Contrary to this, in the semiconductor device 10 according to the first embodiment, as shown in FIG. 1, the IGBT barrier region 34 is formed in the shape of an arch convex toward the front surface 12a of the semiconductor substrate 12 (i.e. upward in the drawing), and the depth of the peak position P1 is shallower than the depth of the peak position P2. Therefore, a path through which a leak current flows in the IGBT bather region 34 is longer as indicated by the arrow 92 in FIG. 4 than in the conventional semiconductor device 110. That is, because the resistance to the flow of a leak current is high, a comparatively small leak current flows. Thus, in the semiconductor device 10 according to the first embodiment, a leak current that flows when the IGBT is being turned on can be made smaller than in the conventional semiconductor device 110. This makes it easy to determine whether the semiconductor device 10 is defective. Further, in the semiconductor device 10 according to the first embodiment, the cathode region 42 is arranged on the lower side of the diode region 80. The collector region 40 is arranged only on the lower side of the IGBT region 70. Therefore, in the diode region 80, a leak current hardly flows even though the diode bather region 54 is substantially flat.

The following describes how the p-n diodes and SBDs of the semiconductor device 10 according to the first embodiment operate. When the p-n diodes and the SBDs are being turned on, such a voltage (forward voltage) is applied between the upper electrode 22 and the lower electrode 26 that the upper electrode 22 becomes higher in electric potential. The following assumes a case where the electric potential of the upper electrode 22 is gradually raised from an electric potential equal to that of the lower electrode 26. A rise in the electric potential of the upper electrode 22 causes a Schottky contact portion at an interface between the diode pillar region 55 and the upper electrode 22 to be electrically connected. That is, the SBD is turned on. This causes electrons to flow from the lower electrode 26 toward the upper electrode 22 via the cathode region 42, the drift region 38, the diode bottom body region 56, the diode bather region 54, and the diode pillar region 55. It should be noted that a presence of a p-n junction between the diode bottom body region 56 and the diode bather region 54 has only a small impact on a current flowing through the SBD, as the p-type impurity density of the diode bottom body region 56 is low and the diode bottom body region 56 is thin. When the SBD is thus being turned on, an electric potential of the diode bather region 54 becomes close to the electric potential of the upper electrode 22. This makes it difficult for a potential difference to be generated at a p-n junction at a boundary between the diode top body region 52 and the diode bather region 54. Especially in the first embodiment, where the diode bather region 54 is formed flat, a distance from the lower end of the diode pillar region 55 to a part of the diode bather region 54 located near the gate insulating layers 16 is shorter than in the case of the IGBT bather region 34, which is formed in the shape of an arch. This makes it difficult for a potential difference to be generated at the p-n junction at the boundary between the diode top body region 52 and the diode barrier region 54. For this reason, even if the electric potential of the upper electrode 22 is raised after the SBD has turned on, this rise does not cause the p-n diode to be turned on for a while. A further rise in the electric potential of the upper electrode 22 causes an increase in an amount of the current flowing through the SBD. The increase in the amount of the current flowing through the SBD causes an increase in potential difference between the upper electrode 22 and the diode bather region 54, thus causing a larger potential difference to be generated at the p-n junction at the boundary between the diode top body region 52 and the diode bather region 54. Therefore, when the electric potential of the upper electrode 22 is raised to an electric potential equal to or higher than a predetermined electric potential, the p-n diode is turned on. That is, holes flow from the upper electrode 22 toward the lower electrode 26 via the diode top body region 52, the diode bather region 54, the diode bottom body region 56, the drift region 38, and the cathode region 42. Further, electrons flow from the lower electrode 26 toward the upper electrode 22 via the cathode region 42, the drift region 38, the diode bottom body region 56, the diode bather region 54, and the diode top body region 52. That is, a current flows from the upper electrode 22 toward the lower electrode 26 via the diode top body region 52, the diode bather region 54, the diode bottom body region 56, the drift region 38, and the cathode region 42. Thus, in the semiconductor device 10, the SBD is turned on first when the electric potential of the upper electrode 22 rises, thus a timing at which the p-n diode is turned on is delayed. This suppresses holes from flowing from the diode top body region 52 into the drift region 38.

Applying a backward voltage (i.e. a voltage that causes the upper electrode 22 to be lower in electric potential) between the upper electrode 22 and the lower electrode 26 after the p-n diode has been turned on causes the p-n diode to perform a reverse recovery operation. That is, while the p-n diode is on, holes are present in the drift region 38. The application of a backward voltage causes the holes in the drift region 38 to be discharged into the upper electrode 22 through the diode top body region 52. This flow of the holes causes a reverse current to be momentarily generated in the p-n diode. However, in the semiconductor device 10, when the p-n diode is being turned on, the SBD suppresses the holes from flowing from the diode top body region 52 into the drift region 38 as mentioned above. This causes only a small number of holes to be present in the drift region 38 when the p-n diode performs the reverse recovery operation. This causes only a small reverse current to be generated during the reverse recovery operation of the p-n diode. Thus, the semiconductor device 10 suppresses the generation of a reverse current during the reverse recovery operation of the p-n diode.

Further, the application of a backward voltage between the upper electrode 22 and the lower electrode 26 causes an electric field to be distributed due to a depletion layer extending from the p-n junction between the diode top body region 52 and the diode bather region 54 and a depletion layer extending from the p-n junction between the drift region 38 and the diode bottom body region 56. This brings about higher voltage resistance with respect to the backward voltage than does a structure including no diode bottom body region 56.

Further, as mentioned above, a p-n diode and an SBD are also formed in the IGBT region 70. The p-n diode and the SBD in the IGBT region 70 function in the same manner as the p-n diode and the SBD in the diode region 80 do. Further, a pillar region, i.e., the IGBT pillar region 35 is also arranged in the IGBT region 70. Therefore, in the IGBT region 70, a reverse recovery current is suppressed in the same manner as in the diode region 80.

The foregoing has described the configuration and operation of the semiconductor device 10 according to the first embodiment. The following describes correspondence between the components described in the first embodiment and those recited in the claims. The upper electrode 22 is an example of the "front surface electrode", and the lower electrode 26 is an example of the "back surface electrode". The IGBT region 70 is an example of the "first cell region", and the diode region 80 is an example of the "second cell region". The gate trenches 14a and 14b are an example of the "first gate trench" and an example of the "second gate trench", respectively. The gate trenches 14b and 14c are an example of the "third gate trench" and an example of the "fourth gate trench", respectively. The IGBT top body region 32 is an example of the "first top body region". The IGBT barrier region 34 is an example of the "first barrier region". The IGBT pillar region 35 is an example of the "first pillar region". The IGBT bottom body region 36 is an example of the "first bottom body region". The diode top body region 52 is an example of the "second top body region". The diode bather region 54 is an example of the "second bather region". The diode pillar region 55 is an example of the "second pillar region". The diode bottom body region 56 is an example of the "second bottom body region". The peak positions P1, P2, P3, and P4 are an example of the "first peak position", an example of the "second peak position", an example of the "third peak position", and an example of the "fourth peak position", respectively.

Second Embodiment

Figure 8:
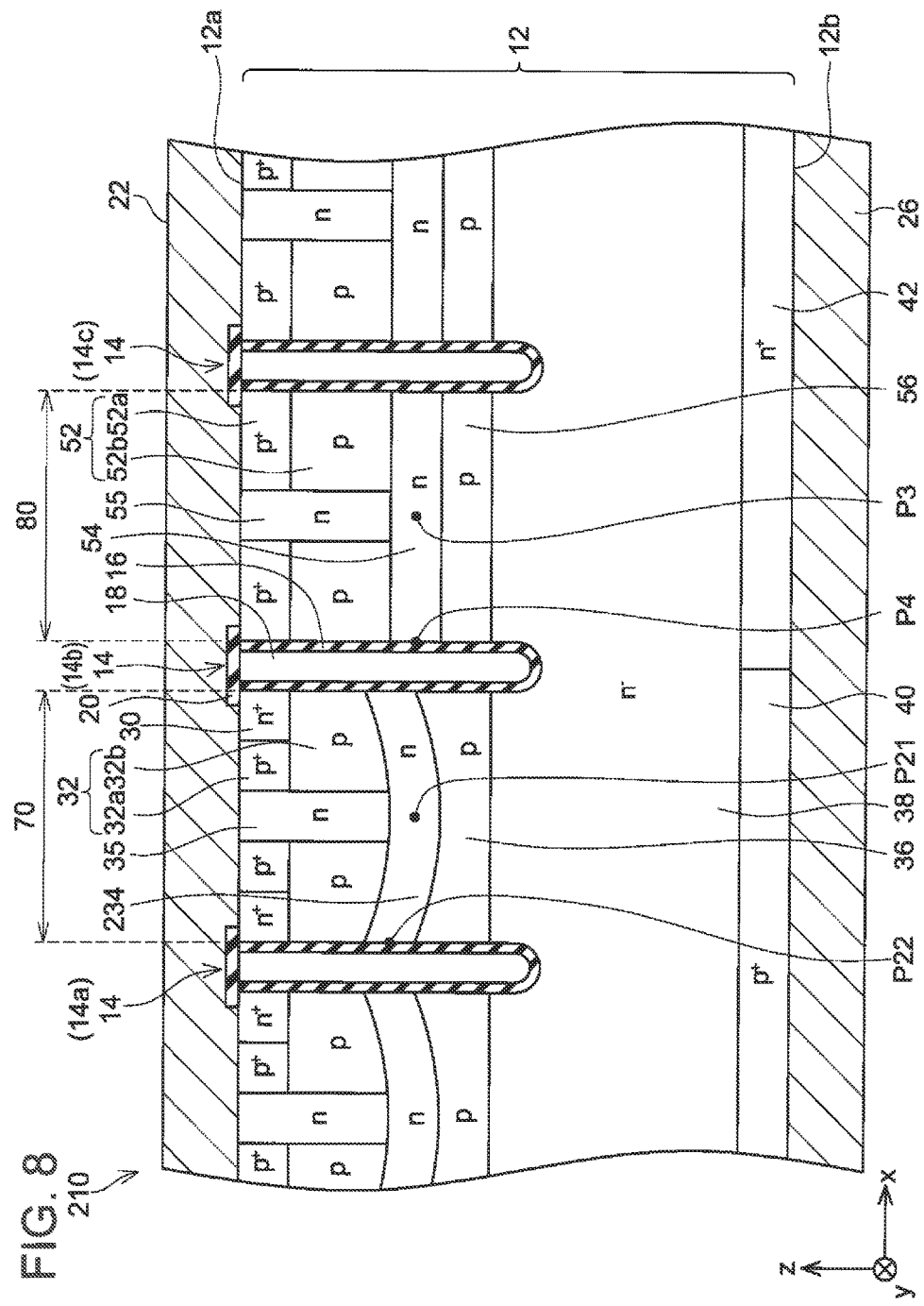
FIG. 8 is a cross-sectional view of a semiconductor device 210 according to a second embodiment.
Figure 9:
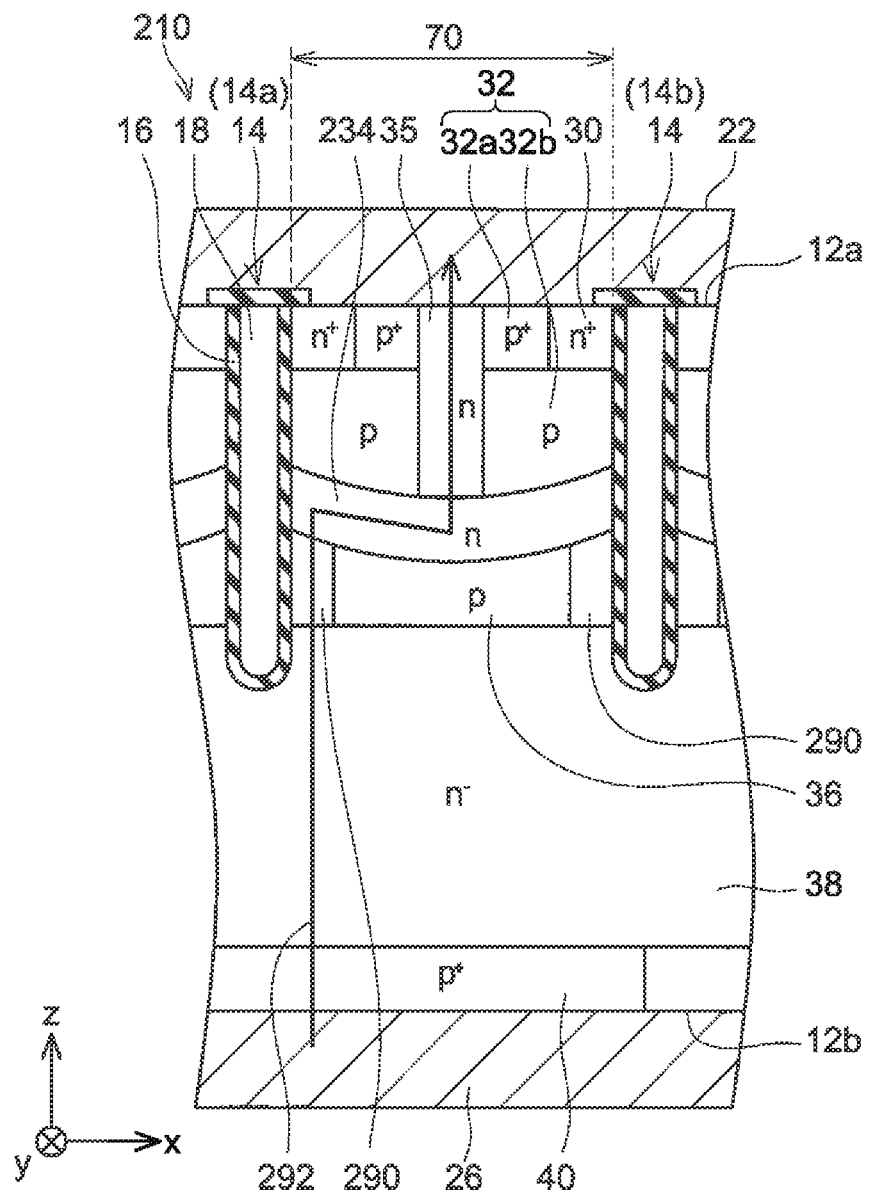
FIG. 9 is an explanatory diagram showing how an IGBT in the semiconductor device 210 according to the second embodiment operates.

Next, a semiconductor device 210 according to a second embodiment is described with reference to FIGS. 8 and 9, with a focus on differences between the second embodiment and the first embodiment. The semiconductor device 210 according to the second embodiment is identical in basic configuration to the semiconductor device 10 according to the first embodiment (see FIG. 1). In FIGS. 8 and 9, the same components as those of the semiconductor device 10 according to the first embodiment are indicated by the same reference numerals.

The semiconductor device 210 according to the second embodiment differs from the semiconductor device 10 according to the first embodiment in shape of an IGBT bather region 234. As shown in FIG. 8, the IGBT bather region 234 is formed in a shape of an arch convex toward the back surface 12b of the semiconductor substrate 12 (i.e. downward in the drawing) as viewed in a cross-sectional view of the semiconductor substrate 12. Therefore, the IGBT bather region 234 includes a peak position P21 where a peak of the n-type impurity density is present within a part on a lower side of a range linked to the IGBT pillar region 35, and a peak position P22 where a peak of the n-type impurity density is present within a part in contact with the gate insulating layer 16, and a depth of the peak position P21 from the front surface 12a is deeper than a depth of the peak position P22 from the front surface 12a.

When the electric potential of the gate electrode 18 reaches the predetermined first threshold value when turning on the IGBT of the semiconductor device 210 according to the second embodiment, a channel 290 is first formed in a part of the IGBT bottom body region 36 located near the gate insulating layers 16 as shown in FIG. 9. At this point in time, no channel has been formed in a part of the IGBT top body region 32 located near the gate insulating layers 16. This causes a leak current to flow from the lower electrode 26 toward the upper electrode 22 via the collector region 40, the drift region 38, the channel 290, the IGBT bather region 234, and the IGBT pillar region 35 as indicated by an arrow 292 in FIG. 9. In the semiconductor device 210 according to the second embodiment, as described above, the IGBT bather region 234 is formed in the shape of an arch convex toward the back surface 12b of the semiconductor substrate 12 (i.e. downward in the drawing), and the depth of the peak position P21 is deeper than the depth of the peak position P22. Therefore, in the second embodiment also, a path through which a leak current flows in the IGBT bather region 234 is longer as indicated by the arrow 292 than in the case of the conventional semiconductor device 110 (see FIG. 6). In the semiconductor device 210 according to the second embodiment also, a leak current that flows when turning on the IGBT can be made smaller than in the conventional semiconductor device 110. Therefore, the semiconductor device 210 according to the second embodiment can bring about operation and effect similar to those which are brought about by the semiconductor device 10 according to the first embodiment.

Third Embodiment

Figure 10:
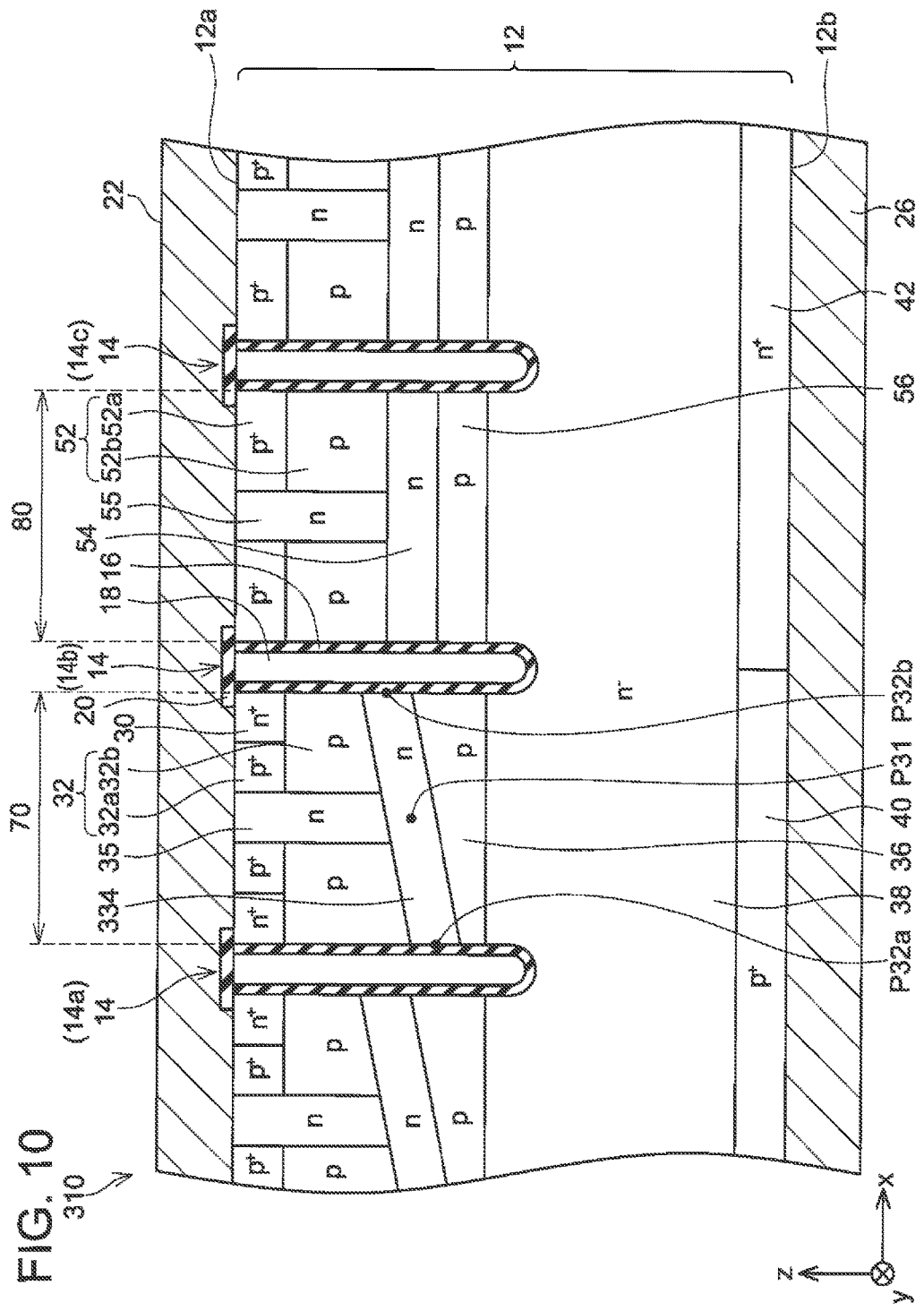
FIG. 10 is a cross-sectional view of a semiconductor device 310 according to a third embodiment.
Figure 11:
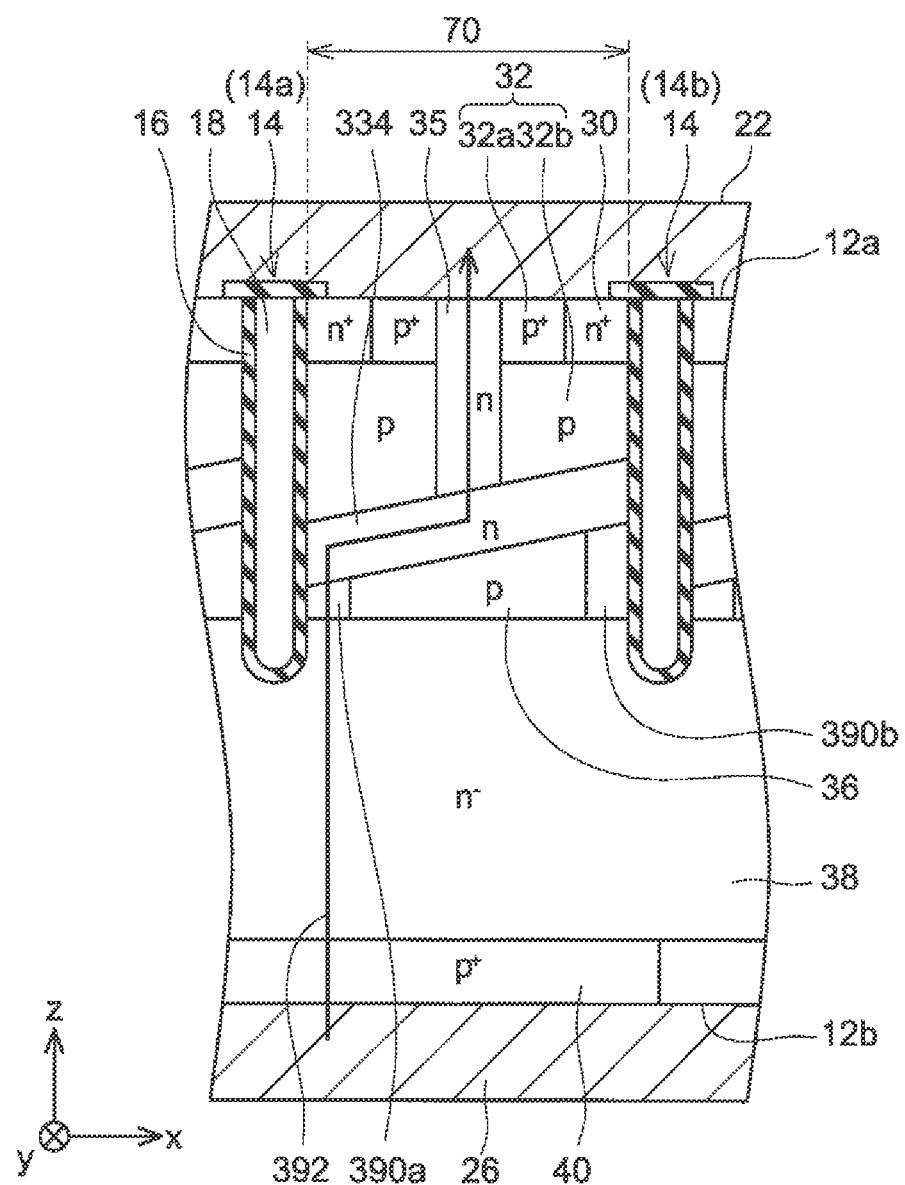
FIG. 11 is an explanatory diagram showing how an IGBT in the semiconductor device 310 according to the third embodiment operates.

Next, a semiconductor device 310 according to a third embodiment is described with reference to FIGS. 10 and 11, with a focus on differences between the third embodiment and the first embodiment. The semiconductor device 310 according to the third embodiment is identical in basic configuration to the semiconductor device 10 according to the first embodiment (see FIG. 1). In FIGS. 10 and 11, also, the same components as those of the semiconductor device 10 according to the first embodiment are indicated by the same reference numerals.

The semiconductor device 310 according to the third embodiment differs from the semiconductor device 10 according to the first embodiment in shape of an IGBT bather region 334. As shown in FIG. 10, the IGBT bather region 334 is formed so that a depth of the IGBT bather region 334 from the front surface 12a becomes shallower as the IGBT bather region 334 extends from the gate trench 14a toward the gate trench 14b in a cross-sectional view of the semiconductor substrate 12. Therefore, in the third embodiment, the IGBT bather region 334 includes a peak position P31 where a peak of the n-type impurity density is present within a part on a lower side of a range linked to the IGBT pillar region 35, and a peak position P32a where a peak of the n-type impurity density is present within a part of the gate trench 14a in contact with the corresponding gate insulating layer 16. A depth of the peak position P31 from the front surface 12a is shallower than a depth of the peak position P32a from the front surface 12a. The IGBT bather region 334 further includes a peak position P32b where a peak of the n-type impurity density is present within a part of the gate trench 14b being in contact with the corresponding gate insulating layer 16. The depth of the peak position P31 from the front surface 12a is deeper than a depth of the peak position P32b from the front surface 12a.

When the electric potential of the gate electrode 18 reaches the predetermined first threshold value when turning on the IGBT of the semiconductor device 310 according to the third embodiment, channels 390a and 390b are first formed in parts of the IGBT bottom body region 36 located near the gate insulating layers 16 as shown in FIG. 11. The channel 390a is formed near the corresponding gate insulating layer 16 in the gate trench 14a, and the channel 390b is formed near the corresponding gate insulating layer 16 in the gate trench 14b. At this point in time, no channel has been formed in a part of the IGBT top body region 32 located near the gate insulating layers 16. This causes a leak current to flow from the lower electrode 26 toward the upper electrode 22 via the collector region 40, the drift region 38, the channel 390a, the IGBT bather region 334, and the IGBT pillar region 35 as indicated by an arrow 392 in FIG. 11. As shown in FIG. 11, a path that goes through the channel 390b is longer and therefore higher in resistance than a path that goes through the channel 390a. Therefore, no leak current flows through the path that goes through the channel 390b. In the semiconductor device 310 according to the third embodiment, as described above, the IGBT bather region 334 is formed so that the depth of the IGBT bather region 334 from the front surface 12a becomes shallower as the IGBT bather region 334 extends from the gate trench 14a toward the gate trench 14b in the cross-sectional view of the semiconductor substrate 12. The depth of the peak position P31 is different from the depths of the peak positions P32a and P32b. Therefore, in the third embodiment also, a path through which a leak current flows in the IGBT bather region 334 is longer as indicated by the arrow 392 than in the case of the conventional semiconductor device 110 (see FIG. 6). In the semiconductor device 310 according to the third embodiment also, a leak current that flows when the IGBT is being turned on can be made smaller than in the conventional semiconductor device 110. Therefore, the semiconductor device 310 according to the third embodiment can bring about operation and effect similar to those which are brought about by the semiconductor device 10 according to the first embodiment.

Fourth Embodiment

Figure 12:
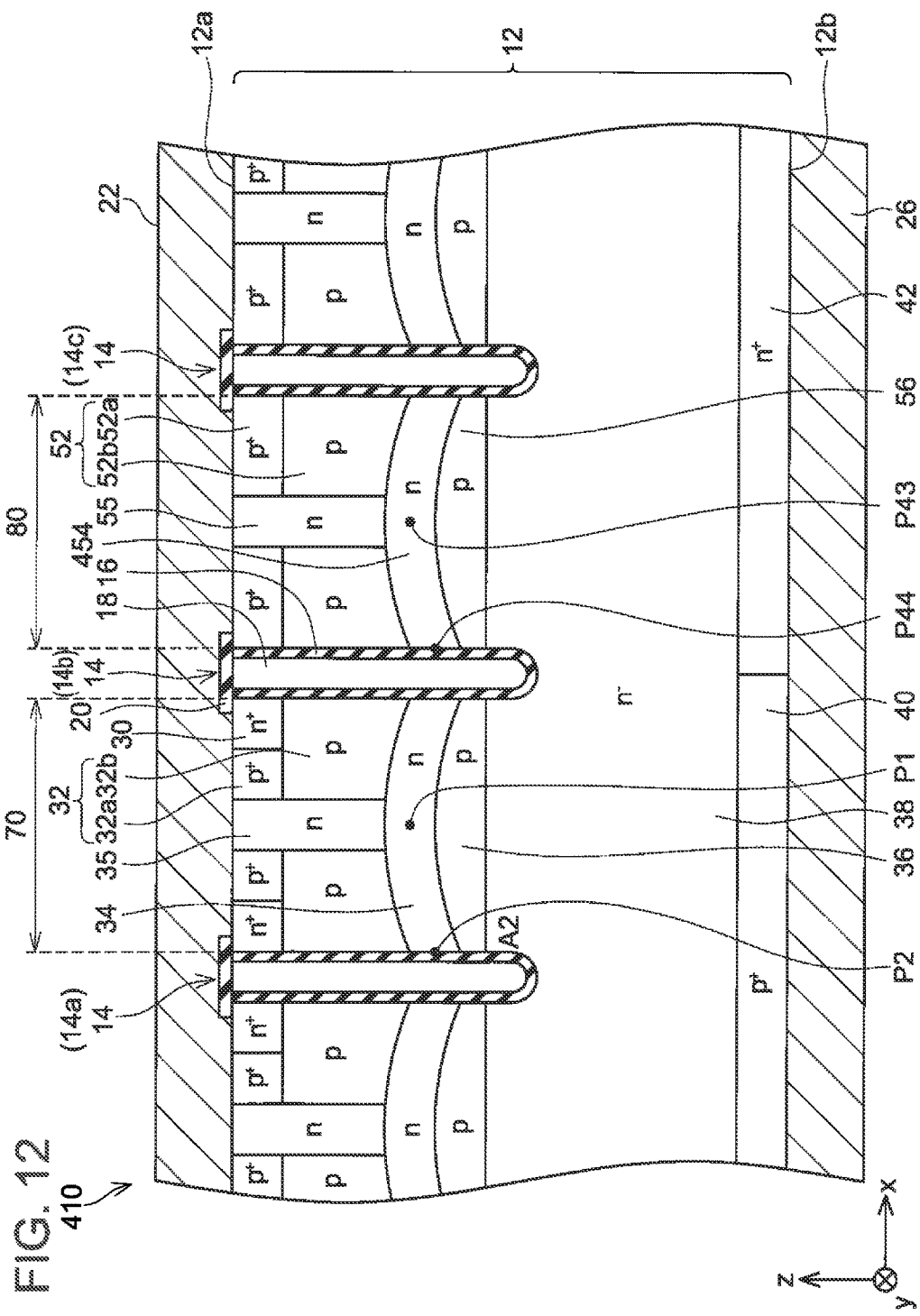
FIG. 12 is a cross-sectional view of a semiconductor device 410 according to a fourth embodiment.

Next, a semiconductor device 410 according to a fourth embodiment is described with reference to FIG. 12, with a focus on differences between the fourth embodiment and the first embodiment. The semiconductor device 410 according to the fourth embodiment also, is identical in basic configuration to the semiconductor device 10 according to the first embodiment (see FIG. 1). In FIG. 12 also, the same components as those of the semiconductor device 10 according to the first embodiment are indicated by the same reference numerals.

The semiconductor device 410 according to the fourth embodiment differs from the semiconductor device 10 according to the first embodiment in shape of a diode bather region 454. As shown in FIG. 12, similarly to the IGBT bather region 34, the diode bather region 454 is formed in a shape of an arch convex toward the front surface 12a of the semiconductor substrate 12 (i.e. upward in the drawing) as viewed in a cross-sectional view of the semiconductor substrate 12. In the fourth embodiment, the diode bather region 454 includes a peak position P43 where a peak of the n-type impurity density is present within a part on a lower side of a range linked to the diode pillar region 55, and a peak position P44 where a peak of the n-type impurity density is present within a part in contact with the gate insulating layer 16, and a depth of the peak position P43 from the front surface 12a is shallower than a depth of the peak position P44 from the front surface 12a.

The p-n diodes and SBDs of the semiconductor device 410 according to the fourth embodiment operate in substantially the same manner as those of the semiconductor device 10 according to the first embodiment. However, in the fourth embodiment, the diode bather region 454 is formed in the shape of an arch. Therefore, as compared with the semiconductor device 10 according to the first embodiment, in which the diode bather region 54 is formed in a flat shape, a potential difference is easily generated between the diode top body region 52 and the diode bather region 454 in a state where the SBDs have been turned on but the p-n diodes are yet to be turned on.

While specific examples of the technology disclosed herein have been described above in detail, these examples are merely illustrative and place no limitation on the scope of the patent claims. The technology described in the patent claims also encompasses various changes and modifications to the specific examples described above. For example, the following modifications may be adopted.

(Modification 1) In each of the embodiments described above, an n-type semiconductor region that corresponds to the emitter regions 30 of the IGBT region 70 is absent in a range of the diode region 80 exposed on the front surface 12a of the semiconductor substrate 12. Alternatively, an n-type semiconductor region may be provided on a front surface of the semiconductor substrate 12 in the diode region 80. This configuration allows the IGBT region and the diode region to have surface structures in common.

(Modification 2) Shapes of the IGBT bather regions 34, 234, and 334 may be any other shapes without being limited to the shapes described in the first to fourth embodiments. In that case, the IGBT bather region may include a first peak position where a peak of the n-type impurity density is present within a part on a lower side of a range linked to the IGBT pillar region 35, and a second peak position where a peak of the n-type impurity density is present within a part in contact with the gate insulating layer 16. A depth of the first peak position from the front surface 12a may be different from a depth of the second peak position from the front surface 12a.

(Modification 3) In each of the embodiments described above, the cathode region 42 is arranged only in the range on the lower side of the diode region 80, and is not arranged in the range on the lower side of the IGBT region 70. Alternatively, the cathode region 42 may also be arranged in the range on the lower side of the IGBT region 70. That is, both the collector region and the cathode region may be arranged in the range on the lower side of the IGBT region 70. In this case, a p-n diode connected between the upper electrode 22 and the lower electrode 26 may be formed by the IGBT top body region 32, the IGBT bather region 34, the IGBT bottom body region 36, the drift region 38, and the cathode region in the range on the lower side of the IGBT region 70. That is, the IGBT top body region 32 may also be used as an anode region.

The following describes some of the technologies disclosed herein. It should be noted that the following technical matters may be useful solely.

In the semiconductor device disclosed herein, the semiconductor substrate may further comprise a second cell region. The second cell region may comprise a p-type second top body region, an n-type second bather region, an n-type second pillar region, and a p-type second bottom body region. The p-type second top body region may be located between a third gate trench and a fourth gate trench which is adjacent to the third gate trench among the plurality of gate trenches. The n-type second bather region may be located between the third gate trench and the fourth gate trench. The n-type second bather region may be in contact with the gate insulating layer at a position deeper than the second top body region. The n-type second pillar region may be located between the third gate trench and the fourth gate trench. The n-type second pillar region may be connected to the front surface electrode and may be linked to the second barrier region. The p-type second bottom body region may be located between the third gate trench and the fourth gate trench. The p-type second bottom body region may be in contact with the gate insulating layer at a position deeper than the second bather region. The second bottom body may be separated from the second top body region by the second bather region. A p-type impurity density of the second bottom body region may be lower than a p-type impurity density of the second top body region. No n-type semiconductor region, which is in contact with the gate insulating layer and is separated from the second bather region and the second pillar region, may be disposed between the third gate trench and the fourth gate trench. The collector region may be disposed on a lower side of the first cell region. The cathode region may be disposed on a lower side of the second cell region. The first bather region may include a first peak position where a peak of the n-type impurity density is present within a part linked to the first pillar region, and a second peak position where a peak of the n-type impurity density is present within a part in contact with the gate insulating layer. The second bather region may include a third peak position where a peak of the n-type impurity density is present within a part linked to the second pillar region, and a fourth peak position where a peak of the n-type impurity density is present within a part in contact with the gate insulating layer. A difference between a depth of the first peak position from the front surface of the semiconductor substrate and a depth of the second peak position from the front surface of the semiconductor substrate may be larger than a difference between a depth of the third peak position from the front surface of the semiconductor substrate and a depth of the fourth peak position from the front surface of the semiconductor substrate.

In the semiconductor device thus configured, a p-n diode is formed by the second top body region, the second bather region, the second bottom body region, the drift region, the cathode region, and the like.

In this semiconductor device, a p-n junction (i.e. a boundary between the second top body region and the second bather region) configuring a p-n diode is formed between the third gate trench and the fourth gate trench. Since this p-n diode has the second pillar region, it is difficult for a reverse recovery current to be generated in the p-n diode. Especially, since the difference between the depths of the peak positions within the second bather region is small, it is difficult for a potential difference to be generated at the boundary between the second top body region and the second bather region. This makes it more difficult for the p-n diode to be turned on, thus making it possible to effectively suppress a reverse recovery current. Further, since the collector region is arranged on the lower side of the first cell region and the cathode region is arranged on the lower side of the second cell region, a leak current hardly flows through the second cell region in a case where the IGBT operates.

The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

What is claimed is:

1. A semiconductor device comprising:
a semiconductor substrate;
a front surface electrode located on a front surface of the semiconductor substrate; and
a back surface electrode located on a back surface of the semiconductor substrate,
wherein a plurality of gate trenches is arranged on the front surface of the semiconductor substrate,
in each of the gate trenches, a gate insulating layer and a gate electrode are located, the gate electrode being insulated from the semiconductor substrate by the gate insulating layer,
the semiconductor substrate comprises a first cell region, the first cell region comprises:
an n-type emitter region located between a first gate trench and a second gate trench which is adjacent to the first gate trench among the plurality of the gate trenches, the n-type emitter region being in contact with the gate insulating layer of at least one of the first gate trench and the second gate trench, and the n-type emitter region being connected to the front surface electrode;
a p-type first top body region located between the first gate trench and the second gate trench, the p-type first top body region being in contact with the gate insulating layer of at least one of the first gate trench and the second gate trench at a position deeper than the n-type emitter region;
an n-type first barrier region located between the first gate trench and the second gate trench, the n-type first barrier region being in contact with the gate insulating layer of at least one of the first gate trench and the second gate trench at a position deeper than the p-type first top body region;
an n-type first pillar region located between the first gate trench and the second gate trench, the n-type first pillar region being connected to the front surface electrode, and the n-type first pillar region being linked to the n-type first barrier region; and
a p-type first bottom body region located between the first gate trench and the second gate trench, the p-type first bottom body region being in contact with the gate insulating layer of at least one of the first gate trench and the second gate trench at a position deeper than the n-type first barrier region, the p-type first bottom body region being separated from the p-type first top body region by the n-type first barrier region, and a p-type impurity density of the p-type first bottom body region being lower than a p-type impurity density or the p-type first top body region,
the semiconductor substrate further comprises:
an n-type drift region located at a position deeper than the first bottom body region, the drift region being separated from the first barrier region by the first bottom body region, and an n-type impurity density of the drift region being lower than an n-type impurity density of the first barrier region;
a p-type collector region connected to the back surface electrode; and
an n-type cathode region connected to the back surface electrode, an n-type impurity density of the cathode region being higher than the n-type impurity density of the drift region, and
the first barrier region includes a first peak position where a peak of the n-type impurity density is present within a part linked to the first pillar region, and a second peak position where a peak of the n-type impurity density is present within a part in contact with the gate insulating layer of at least one of the first gate trench and the second gate trench, and
a depth of the first peak position from the front surface of the semiconductor substrate is different from a depth of the second peak position from the front surface of the semiconductor substrate.

2. The semiconductor device as in claim 1, wherein
the semiconductor substrate further comprises a second cell region,
the second cell region comprises:
a p-type second top body region located between a third gate trench and a fourth gate trench which is adjacent to the third gate trench among the plurality of the gate trenches;
an n-type second barrier region located between the third gate trench and the fourth gate trench, the n-type second barrier region being in contact with the gate insulating layer of at least one of the third gate trench and the fourth gate trench at a position deeper than the p-type second top body region;

an n-type second pillar region located between the third gate trench and the fourth gate trench, the n-type second pillar region being connected to the front surface electrode, and the n-type second pillar region being linked to the n-type second barrier region; and a p-type second bottom body region located between the third gate trench and the fourth gate trench, the p-type second bottom body region being in contact with the gate insulating layer of at least one of the third gate trench and the fourth gate trench at a position deeper than the n-type second barrier region, the p-type second bottom body region being separated from the p-type second top body region by the n-type second barrier region, and a p-type impurity density of the p-type second bottom body region being lower than a p-type impurity density of the p-type second top body region, no n-type semiconductor region, which is in contact with the gate insulating layer of at least one of the third gate trench and the fourth gate trench and separated from the n-type second barrier region and the second pillar region, is disposed between the third gate trench and the fourth gate trench, the collector region is disposed on a lower side of the first cell region, the cathode region is disposed on a lower side of the second cell region, the second barrier region includes a third peak position where a peak of the n-type impurity density is present within a part linked to the second pillar region, and a fourth peak position where a peak of the n-type impurity density is present within a part in contact with the gate insulating layer of at least one of the third gate trench and the fourth gate trench, and a difference between the depth of the first peak position from the front surface of the semiconductor substrate and the depth of the second peak position from the front surface of the semiconductor substrate is larger than a difference between a depth of the third peak position from the front surface of the semiconductor substrate and a depth of the fourth peak position from the front surface of the semiconductor substrate.

\* \* \* \* \*

UNITED STATES PATENT AND TRADEMARK OFFICE
CERTIFICATE OF CORRECTION

PATENT NO. : 9,666,704 B2
APPLICATION NO. : 14/942539
DATED : May 30, 2017
INVENTOR(S) : Hiroshi Hosokawa It is certified that error appears in the above-identified patent and that said Letters Patent is hereby corrected as shown below:

In the Specification

In Column 1, Lines 23, 27, 29, 33, 37, 40, 42, 49 replace "bather" with --barrier--.

In Column 2, Lines 2, 5, 32, 54, 60, 63 replace "bather" with --barrier--.

In Column 3, Lines 16, 49 replace "bather" with --barrier--.

In Column 5, Lines 7, 40, 42, 44, 46, 48, 52, 53, 62, 67 replace "bather" with --barrier--.

In Column 6, Lines 9, 14, 16, 27, 28, 30, 32, 42, 61, 63, 65, 67 replace "bather" with --barrier--.

In Column 7, Lines 2, 11, 16, 23, 25, 42, 43, 45, 47, 56 replace "bather" with --barrier--.

In Column 8, Lines 3, 4, 7, 8, 30, 38, 47, 52, 58, 61, 65 replace "bather" with --barrier--.

In Column 9, Lines 24, 28, 31, 33, 45, 50 replace "bather" with --barrier--.

In Column 10, Lines 6, 7, 9, 10, 33, 36, 65 replace "bather" with --barrier--.

In Column 11, Lines 12, 28, 31, 36, 40, 41, 43, 44, 56, 59, 65 replace "bather" with --barrier--.

In Column 12, Lines 2, 5, 37 replace "bather" with --barrier--.

In Column 13, Lines 4, 5, 29, 34, 52, 55, 61 replace "bather" with --barrier--.

In Column 14, Lines 21, 22, 24, 27, 35, 56, 63, 64, 66 replace "bather" with --barrier--.

Signed and Sealed this
Eleventh Day of July, 2017

Joseph Matal
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 9,666,704 B2

In Column 15, Lines 4, 30, 32, 36, 49, 52, 54 replace "bather" with --barrier--.

In Column 16, Lines 6, 9, 28, 39, 44, 46, 56, 58, 62, 67 replace "bather" with --barrier--.

In Column 17, Lines 5, 19, 24, 29, 31 replace "bather" with --barrier--.